US012693602B2

(12) United States Patent
Winters et al.

(10) Patent No.: US 12,693,602 B2
(45) Date of Patent: Jul. 28, 2026

(54) SYSTEMS AND METHODS FOR DISTRIBUTING LIGHT DELIVERY

(71) Applicant: ASML Netherlands B.V., Veldhoven (NL)

(72) Inventors: Jasper Winters, Nieuw Vennep (NL); Erwin John Van Zwet, Pijnacker (NL); Marcus Johannes Van Der Lans, Hillegom (NL); Pieter Willem Herman De Jager, Middelbeers (NL); Geerten Frans Ijsbrand Kramer, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 220 days.

(21) Appl. No.: 18/420,091

(22) Filed: Jan. 23, 2024

(65) Prior Publication Data

US 2024/0160110 A1 May 16, 2024

Related U.S. Application Data

(63) Continuation of application No. PCT/EP2022/068478, filed on Jul. 4, 2022.

(30) Foreign Application Priority Data

Jul. 23, 2021 (EP) .................................... 21187368

(51) Int. Cl.
*G03F 7/00* (2006.01)
(52) U.S. Cl.
CPC ...... *G03F 7/70291* (2013.01); *G03F 7/70508* (2013.01); *G03F 7/70558* (2013.01)

(58) Field of Classification Search
CPC ............. G03F 7/70291; G03F 7/70508; G03F 7/70558
See application file for complete search history.

(56) References Cited

U.S. PATENT DOCUMENTS 6,379,867 B1 4/2002 Mei et al.
9,703,207 B1 * 7/2017 Cavan ................ G01N 21/9501

FOREIGN PATENT DOCUMENTS

| EP | 3605231 A1 | 2/2020 |
| JP | 2001343924 A | 12/2001 |
| JP | 2004128272 A | 4/2004 |
| JP | 2005309416 A | 11/2005 |
| JP | 2014168040 A | 9/2014 |

(Continued)

OTHER PUBLICATIONS

PCT International Search Report issued in related PCT Application No. PCT/EP2022/068478, mailed Nov. 14, 2022 (2 pgs.).

(Continued)

*Primary Examiner* — Peter B Kim
(74) *Attorney, Agent, or Firm* — Finnegan, Henderson, Farabow, Garrett & Dunner LLP

(57) ABSTRACT

A method for improved sequencing of light delivery in a lithographic process includes determining a sequence of intensities of light to be delivered that includes an interval within the sequence of intensities where substantially no light is delivered to the substrate and delivering light to a substrate by a light source utilizing a digital mirror device (DMD) according to the sequence of intensities.

20 Claims, 16 Drawing Sheets

(56)            References Cited

FOREIGN PATENT DOCUMENTS

| | | | |
|---|---|---|---|
| JP | 2015510269 | A | 4/2015 |
| WO | 2020025246 | A1 | 2/2020 |

OTHER PUBLICATIONS

Light Processing (DLP) device by Texas Instruments (http://www. ti.com/lsds/ti/analog/dlp/getting-Started.page#how-mirrors-work) (6 pgs.).
Silicon Light Machines—GLV Technology (http:/www.siliconlight. com/en/technology/glv.html) (2 pgs.).

\* cited by examiner

SYSTEMS AND METHODS FOR DISTRIBUTING LIGHT DELIVERY

CROSS-REFERENCE TO RELATED APPLICATIONS

This application claims priority of International application PCT/EP2022/068478, filed on 4 Jul. 2022, which claims priority of EP application 21187368.2, filed on 23 Jul. 2021. These application are incorporated herein by reference in their entireties.

TECHNICAL FIELD

The description herein relates generally to patterning processes. More particularly, the disclosure includes apparatuses, methods, and computer program products for improving the delivery of light in lithographic processes.

BACKGROUND

A lithographic projection apparatus can be used, for example, in the manufacture of integrated circuits (ICs). A pattern corresponding to an individual layer of the IC ("design layout") can be transferred onto a target portion (e.g., comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices, and 2D and/or 3D additive manufacturing.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k1\times\lambda/NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Methods, systems, and computer programs for improving the delivery of light during a lithographic process are disclosed. In some embodiments of the present disclosure, a method for improved sequencing of light delivery in a lithographic process includes determining a sequence of intensities of light to be delivered that includes an interval within the sequence of intensities where substantially no light is delivered to the substrate; and delivering light to a substrate by a light source utilizing a digital mirror device (DMD) according to the sequence of intensities.

In some variations, the method can further include determining a target intensity of light to deliver to a spot at the substrate. The determined sequence of intensities can be delivered to the substrate by the digital mirror device (DMD) to reach the target intensity where substantially no light is delivered to the substrate during the interval. This can include storing, in a physical memory, a set of instructions for the sequence of intensities of light. As such, in some variations, the presence of the interval can reduce an influence of an upcoming set of instructions in the sequence of intensities that is stored in the physical memory for a configuration of the DMD.

In some variations, the sequence of intensities is represented by bits stored in physical memory and the interval is located in the sequence after a most significant bit. An asymmetric distribution of the sequence of intensities can be determined that reduces a difference between a delivered center of gravity of the spot and the target center of gravity of the spot.

In some embodiments of the present disclosure, a method for improved sequencing of light delivery in a lithographic process includes determining a target intensity of light to deliver to a spot at a substrate; determining a sequence of intensities of light to be delivered to the substrate by a digital mirror device (DMD) to reach the target intensity, the sequence of intensities including an interval within the sequence of intensities where substantially no light is delivered to the substrate; storing, in a physical memory, a set of instructions for the sequence of intensities of light; and delivering light to the substrate by a light source utilizing the DMD according to the sequence of intensities, wherein the presence of the interval reduces an influence of an upcoming set of instructions in the sequence of intensities that is stored in the physical memory for a configuration of the DMD.

In some variations, the sequence of intensities can be represented by bits stored in physical memory and the interval is located in the sequence after a most significant bit. A symmetric distribution of the sequence of intensities can be determined that reduces a difference between a delivered center of gravity of the spot and a target center of gravity of the spot.

In other variations, a method can also include modifying the symmetric distribution into an asymmetric distribution by including an asymmetry into the sequence of intensities, the asymmetry further reducing the difference between the delivered center of gravity and the target center of gravity. The delivered center of gravity can be adjusted by changing the sequence of the intensities or a location of the interval.

In yet other variations, the sequence of intensities can be an 8-bit intensity distribution, symmetric, and/or can include skipping delivery of the light between two delivered intervals of light.

Also, some variations can include determining the sequence of intensities separately for each of the mirrors in the DMD.

In some embodiments of the present disclosure, a computer program product comprising a non-transitory computer readable medium having instructions recorded thereon, the instructions when executed by a computer implementing the method of any of the above described methods.

In some embodiments of the present disclosure, a system for delivering light to a substrate includes a light source; a digital mirror device; a physical memory configured to store instructions for delivery of light from the light source utilizing the digital mirror device; and a non-transitory computer readable medium having instructions recorded thereon, the instructions when executed by a computer cause operations comprising: determining a target intensity of light to deliver to a spot at a substrate; determining a sequence of intensities of light to be delivered to the substrate by a digital mirror device (DMD) to reach the target intensity, the sequence of intensities including an interval within the sequence of intensities where substantially no light is delivered to the substrate; storing, in a physical memory, a set of instructions for the sequence of intensities of light; and delivering light to the substrate by a light source utilizing the DMD according to the sequence of intensities, wherein the presence of the interval reduces an influence of an upcoming set of instructions in the sequence of intensities that is stored in the physical memory for a configuration of the DMD.

In some variations, the physical memory can be located proximate the DMD such that electrical charges utilized for the storing of the sequence in the physical memory causes a deviation in an angle of a mirror in the DMD. For example, the physical memory can be located less than 1 mm from the digital mirror device. Also, the system can include a control system configured to actuate mirrors in the digital mirror device to deliver the sequence of intensities of light to the substrate. The system may also include a micro-lens array (MLA) configured to direct light from the DMD to the substrate. The system may also be configured to manufacture computer chips or flat panel displays.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

As used herein, the term "substrate" describes a material that light can be directed to as part of a manufacturing process. For example, substrate can include a photoresist, wafer, flat panel display, slurry with photo-sensitive material and particles of (e.g., metal or other functional material), etc.

As used herein, the term "patterning process" or "printing" means a process that creates an etched substrate by the application of specified patterns of light as part of a lithography process. A patterning process can also include any process involving the delivery of light in manufacturing, for example in the development of flat screen devices or integrated circuits.

One or more embodiments of a lithographic system and apparatus, a lithographic method, a programmable patterning device and other apparatuses, articles of manufacture and methods are described herein. In some embodiments of the present disclosure, a low cost and/or flexible maskless lithographic apparatus is provided. As it is maskless, no conventional mask is needed to expose, for example, patterns for use in the manufacturing of ICs (computer chips) or flat panel displays. Similarly, one or more rings are not needed for packaging applications; the programmable patterning device can provide digital edge-processing "rings" for packaging applications to avoid edge projection. Maskless (digital patterning) can also enable patterning on a flexible substrate. As described herein, various embodiments of the disclosed systems and methods allow for increasing the tolerances for alignment/positioning of lens arrays as used in lithographic manufacturing.

Figure 1:
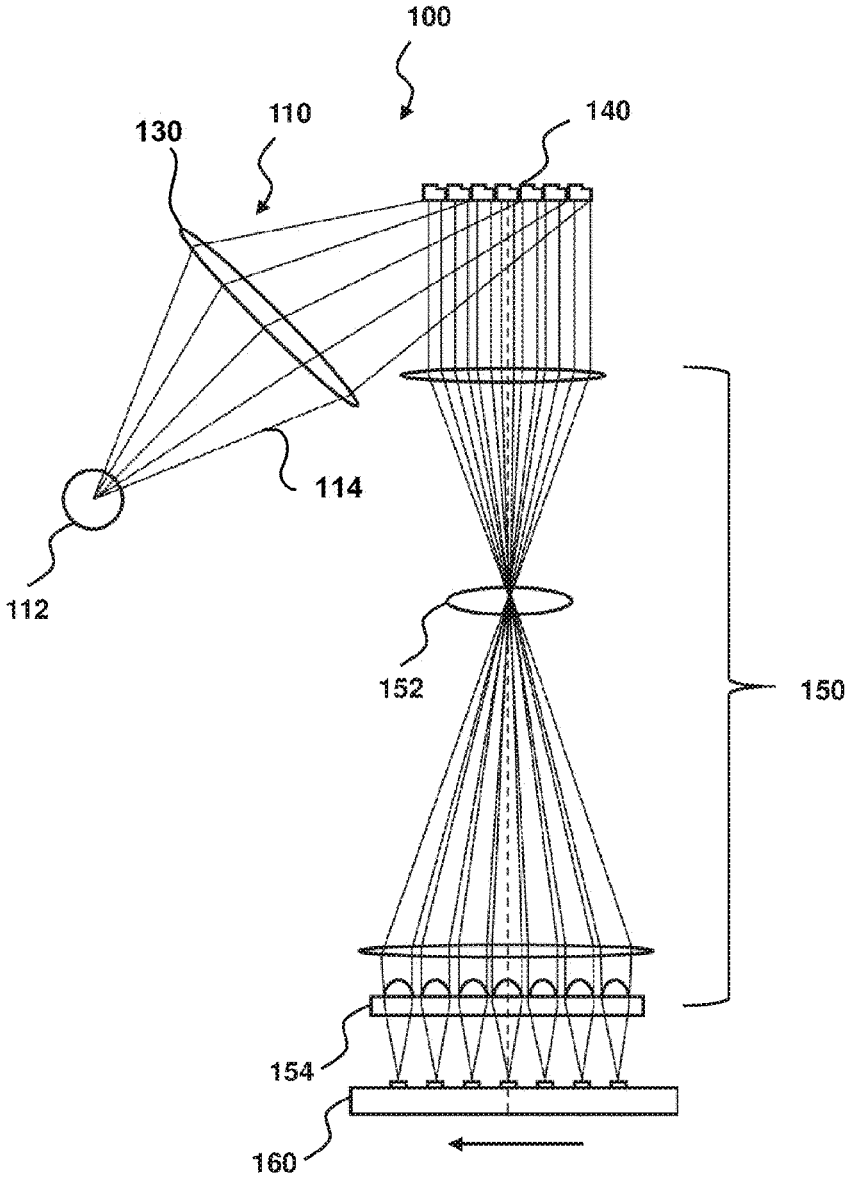
FIG. 1 is a simplified diagram illustrating an exemplary maskless lithography system, according to some embodiments of the present disclosure.

FIG. 1 is a simplified diagram illustrating an exemplary lithography system, according to some embodiments of the present disclosure. As shown in FIG. 1, lithographic apparatus 100 can include a patterning device 110 and a projection system 150. Patterning device 110 can include light source 112 (such as a laser diode as discussed herein) and a mirror array 140. Mirror array 140 can receive light (also referred to herein as radiation beam or beam 114) from light source 112 and cause beam 114 to laterally displace in the X- and/or Y-directions. In some embodiments, the patterning device 110 may include lens 130 to image the radiation beam 114 from the light source 112 to mirror array 140.

The deflected beam 114 from mirror array 140 can be received by projection system 150. Projection system 150 can include objective lens 152, lens array 154, and any number of other lenses or lens arrays for performing focusing, magnification, aberration correction, etc. Objective lens 152 can be arranged to receive the beam 114 from patterning device 110. In the example of FIG. 1, beam 114 diverges from objective lens 152 and is received by lens array 154, which can include any number of individual lenses. Lens array 154 can then focus beam 114 onto substrate 160. As described further herein, substrate 160 can move relative to lithographic apparatus 100 as illustrated by the arrow.

By controlling the amplitude of light imaged onto specific locations of substrate 160, maskless lithography can be performed, as well as methods incorporating greyscaling (described in further detail below) that provide benefits to the lithography process. Accordingly, in some embodiments, a method of performing lithography can include illuminating mirror array 140 with beam 114. Mirror array 140 can include a number of mirrors that receive the light. The light can be imaged onto substrate 160 to create a pattern.

In some embodiments, there can be a single light source 112 for mirror array 140. In other embodiments, light source 112 can comprise multiple light sources (e.g., 2, 3, 6, 10, etc.) that are combined to provide illumination. In some embodiments, light source 112 can be toggled on and off with a toggle frequency corresponding to an adjustment frequency of mirror array 140. For example, if mirror array 140 is able to change its configuration 30 times a second (e.g., 1/60 second stationary and 1/60 second for adjustment), then light source 112 can be operated to turn on and off such that mirror array 140 is not illuminated during its 1/60 second adjustment period. In some embodiments, one or more laser diodes can act as light source 112 and can be controlled to emit the light, for example at the toggle frequency or pattern, or continuously.

In some embodiments, a lithography system can include multiple light sources (illustrated collectively in FIG. 1 as light source 112) configured to generate light having multiple light amplitudes. The light can then form a pattern at a mirror array configured to direct the light with the pattern to a substrate.

Optionally, the lithographic apparatus can comprise a radiation system (not shown) to supply radiation (e.g., ultraviolet (UV) radiation) to the plurality of light sources 112. If the patterning device is a radiation source itself, e.g., a laser diode array or a LED array, the lithographic apparatus can be designed without a radiation system, i.e. without a radiation source other than the patterning device itself, or at least a simplified radiation system.

The radiation system can include an illumination system (illuminator) configured to receive radiation from a radiation source. The illumination system can include one or more of the following elements: a radiation delivery system (e.g., suitable directing mirrors), a radiation conditioning device (e.g., a beam expander), an adjusting device to set the angular amplitude distribution of the radiation (generally, at least the outer and/or inner radial extent (which can be referred to as σ-outer and σ-inner, respectively) of the amplitude distribution in a pupil plane of the illuminator can be adjusted), an integrator, and/or a condenser. The illumination system can be used to condition the radiation provided to light sources 112 to have a desired uniformity and amplitude distribution in its cross-section. The illumination system can be arranged to divide radiation into sub-beams that can, for example, each be associated with one or more of the plurality of light sources 112. A two-dimensional diffraction grating can, for example, be used to divide the radiation into sub-beams. In the present description, the terms "beam of radiation," "radiation beam," and "beam" encompass, but are not limited to, the situation in which beam 114 is comprised of a plurality of such sub-beams of radiation.

In other embodiments, the radiation system can also include a radiation source (e.g., an excimer laser) to produce the radiation for supply to or by light source 112. The radiation source and the lithographic apparatus 100 can be separate entities, for example when the radiation source is an excimer laser. In such cases, the radiation source is not considered to form part of the lithographic apparatus 100 and the radiation is passed from the source to the illuminator. In other cases, the radiation source can be an integral part of the lithographic apparatus 100, for example when the source is a mercury lamp. Both of these scenarios are contemplated within the scope of the present disclosure.

In some embodiments, the radiation source, which in an example can be light source 112, can provide radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In some embodiments, the radiation has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In some embodiments, the radiation can have a wavelength including 436 nm, 405 nm, 365 nm, 355 nm, 248 nm, 193 nm, 157 nm, 126 nm, and/or 13.5 nm. In some embodiments, the radiation can include a wavelength of around 365 nm or around 355 nm. In some embodiments, the radiation can include a broad band of wavelengths, for example encompassing 365 nm, 405 nm and 436 nm. A 355 nm laser source can also be used. In some embodiments, the radiation can have a wavelength of about 405 nm.

In some embodiments, radiation can be directed from the illumination system at the patterning device 110 at an angle between 0 and 90°, e.g., between 5 and 85°, between 15 and 75°, between 25 and 65°, or between 35 and 55°. The radiation from the illumination system can be provided directly to the patterning device 110 (i.e. without relying on mirror array 140). In some embodiments, radiation can be directed from the illumination system to the patterning device 110 by means of a beam splitter configured such that the radiation is initially reflected by the beam splitter and directed to the patterning device 110. The patterning device 110 can modulate beam 114 and reflect it back to the beam splitter which transmits the modulated beam toward the substrate 160. However, alternative arrangements can be used to direct radiation to the patterning device 110 and subsequently to the substrate 160. In particular, an illumination system arrangement may not be required if a transmissive patterning device 110 (e.g., an LCD array) is used or the patterning device 110 is self-emissive (e.g., laser diodes).

Although lithography apparatus 100 according to some embodiments is herein described as being for exposing a substrate, lithography apparatus 100 can also be used to expose a resist on a substrate or used to project a patterned beam 114 for use in resistless lithography.

To address pixels (or, more generally, locations) on substrate that need to be exposed, mirror array 140 can be provided that directs beam 114 to the desired position. In some embodiments, beam 114 can be directed by mirror array 140 to spots on substrate 160 that need to be exposed. In some embodiments, mirror array 140 can be configured to deflect beam 114 in both X- and Y-directions to position the spot on a pixel on the substrate. When a portion of beam 114 is not needed, it can be deflected towards a beam dump.

As discussed above, mirror array 140 can facilitate deflection of beam 114 from light source 112 in the X- and/or Y-direction. In other words, this type of mirror array 140 can point the beam 114 towards a specific location on lens array 154 and thereby to substrate 160. In some embodiments, mirror array 140 can deflect the radiation in only the Y-direction or only the X-direction. In some embodiments, the mirror array 140 can deflect the radiation in both X- and Y-directions.

In some embodiments, mirror array 140 can be a mechanical (i.e., galvanometer-type), an electro-optic, and/or acousto-optic mirror array. A mechanical mirror array tends to provide the largest number of resolvable radiation spots (i.e., a resolvable spot means that the beam is deflected by an angle equal to its own angular spread) but tends to be slowest in terms of spot scan rate. An electro-optic mirror array tends to be the fastest in terms of spot scan rate but tends to have the smallest number of resolvable radiation spots.

In some embodiments, the mirror array 140 can be an electro-optical mirror array. An electro-optical mirror array can provide a switching speed of up to a few nanoseconds. In some embodiments, the electro-optical mirror array can provide deflection angles of +/−15 degrees. In some embodiments, this can yield about 600 radiation spots for an input beam divergence of 0.05 degrees. In some embodiments, use of an electro-optical mirror array can avoid having a fast moving mechanical part for radiation deflection. In some embodiments, there can be no moving optical elements between the radiation source 112 and the substrate 160.

The electro-optical mirror array can include an optically transparent piezo material. Thus, in some embodiments, beam 114 can be steered due to a potential difference applied over the piezo material. For example, when a potential difference is applied across such an optically transparent material, the index of refraction of the material changes, which changes the direction of beam propagation (i.e., the radiation beam can be deflected). In some embodiments, the material is selected from the following: $LiNbO_3$, $LiTaO_3$, $KH_2PO_4$ (KDP), or $NH_4H_2PO_4$ (ADP). $LiTaO_3$ is transparent at the 405 nm wavelength.

Projection system 150 (e.g., a quartz and/or $CaF_2$ lens system or a catadioptric system comprising lens elements made from such materials, or a mirror system) can be used to project beam 114 onto of substrate 160. Projection system 150 can project a first greyscale pattern provided by light source 112 and mirror array 140 such that the first greyscale pattern is coherently formed on the substrate 160.

In this respect, the projection system can include a focusing element, or a number of focusing elements (herein referred to generically as a mirror array or lens array 154) e.g., a micro-lens array 154 (MLA) or a Fresnel lens array 154, to form the secondary sources and to image spots onto substrate 160.

In some embodiments, the light can be imaged onto a lens array 154 that includes lenses that focus the light onto substrate 160. In some embodiments, substrate 160 can be illuminated multiple times at a location to deliver a total light amplitude.

In some embodiments, lens array 154 (e.g., an MLA) can include at least 10 focusing elements, e.g., at least 100 focusing elements, at least 1,000 focusing elements, at least 10,000 focusing elements, at least 100,000 focusing elements, or at least 1,000,000 focusing elements. In some embodiments, the number of lenses in the lens array 154 can be equal to the number or mirrors in mirror array 140.

In some embodiments, the lens array 154 is movable at least in the direction to and away from substrate, e.g., with the use of one or more actuators. Being able to move the lens array 154 to and away from substrate allows, e.g., for focus adjustment without having to move substrate 160. In some embodiments, individual lens element in the lens array 154, for instance each individual lens element in the lens array 154, are movable at least in the direction to and away from the substrate (e.g., for local focus adjustments on non-flat substrates or to bring each optical column into the same focus distance).

Any of the lenses in lens array 154 can focus light onto a spot on the substrate. As used herein, "spot" means an area on the substrate where the light from one or more lenses reaches substrate 160. The spot can be, but is not necessarily, a focal point of any particular lens. In some embodiments, a spot can correspond to a waist of a Gaussian beam. A spot may be circular, elliptical, or any other shape as a result of the distance, angle, etc. of the substrate and the beam, the shape of any lenses, beam blocks with shaped apertures, etc.

In some embodiments, a spot size can be 10 microns or less, 5 microns or less, e.g., 3 microns or less, 2 microns or less, 1 micron or less, 0.5 micron or less, 0.3 micron or less, or about 0.1 micron. In some embodiments, spot size on the substrate is 0.1 micron or more, 0.2 micron or more, 0.3 micron or more, 0.5 micron or more, 0.7 micron or more, 1 micron or more, 1.5 microns or more, 2 microns or more, or 5 microns or more. In some embodiments, a spot size is about 0.1 micron. In some embodiments, a spot size is about 0.5 micron. In some embodiments, a spot size is about 1 micron. Such sizes can be applied to a diameter, major or semi-major axis, or other relevant dimension of the spot.

In some embodiments, the lithographic apparatus can include a controller that generates signals to set the patterning device to the requisite state at each stage during the exposure process. The pattern to be formed on the substrate can be provided to the lithographic apparatus in a vector-defined format e.g., GDSII. In order to convert the design information into the control signals, the controller can include one or more data manipulation devices that can be configured to perform a processing step on a data stream that represents the pattern. The data manipulation devices can collectively be referred to as the "datapath."

The data manipulation devices of the datapath can be configured to perform one or more of the following functions: converting vector-based design information into bit-map pattern data; converting bitmap pattern data into a required radiation dose map (namely a required radiation dose profile across the substrate); converting a required radiation dose map into required radiation amplitude values for each light source; and converting the required radiation amplitude values for each light source into corresponding control signals.

In some embodiments, the control signals can be supplied to the light sources 112 and/or one or more other devices (e.g., a mirror array and/or sensor) by wired or wireless communication. Further, signals from the light sources 112 and/or from one or more other devices (e.g., a mirror array and/or sensor) can be communicated to the controller. In a similar manner to the control signals, power can be supplied to the light sources 112 or one or more other devices (e.g., a mirror array and/or sensor) by wired or wireless means. For example, in a wired example, power can be supplied by one or more lines, whether the same as the ones that carry the signals or different. A sliding contact arrangement can be provided to transmit power. In a wireless example, power can be delivered by RF coupling.

While the previous discussion focused on the control signals supplied to the light sources 112 and/or one or more other devices (e.g., a mirror array and/or a sensor), they should be understood to encompass in addition or alternatively, through appropriate configuration, transmission of signals from the light sources 112 and/or from one or more other devices (e.g., a mirror array and/or sensor) to the controller. So, communication can be one-way (e.g., only to or from the light sources 112 and/or one or more other devices (e.g., a mirror array and/or sensor)) or two-way (i.e., from and to the light sources 112 and/or one or more other devices (e.g., a mirror array and/or sensor)).

In some embodiments, the control signals to provide the pattern can be altered to account for factors that can influence the proper supply and/or realization of the pattern on the substrate. For example, a correction can be applied to the control signals to account for the heating of one or more of the light sources 112, lenses, etc. Such heating can cause changed pointing direction of the light sources 112, lenses, etc., change in uniformity of the radiation, etc. In some embodiments, a measured temperature and/or expansion/contraction associated with light sources 112 and/or other element from, e.g., a sensor can used to alter the control signals that would have been otherwise provided to form the pattern. So, for example, during exposure, the temperature of the light sources 112 can vary, the variance causing a change of the projected pattern that would be provided at a single constant temperature. Accordingly, the control signals can be altered to account for such variance. Similarly, in some embodiments, results from the alignment sensor and/or the level sensor can be used to alter the pattern provided by the light sources 112. The pattern can be altered to correct, for example, distortion, which can arise from, e.g., optics (if any) between the light sources 112 and the substrate 160, irregularities in the positioning of the substrate 160, unevenness of the substrate 160, etc.

With the aid of a positioning device (and optionally a position sensor on a base (e.g., an interferometric measuring device that receives an interferometric beam, a linear encoder or a capacitive sensor)), substrate 160 can be moved accurately, e.g., so as to position different target portions in the path of beam 114. In other embodiments, a positioning device for light sources 112 can be used to accurately correct the position of light sources 112 with respect to the path of beam 114, e.g., during a scan. For example, some embodiments can include a control system that controls a scanning of a substrate relative to the MLA or other components of the optical column described herein (e.g., having any combination of components in FIG. 1). The control system can thus provide two-dimensional horizontal translations of the substrate, a vertical translation, or a rotation of the substrate, in any combination.

Figure 2:
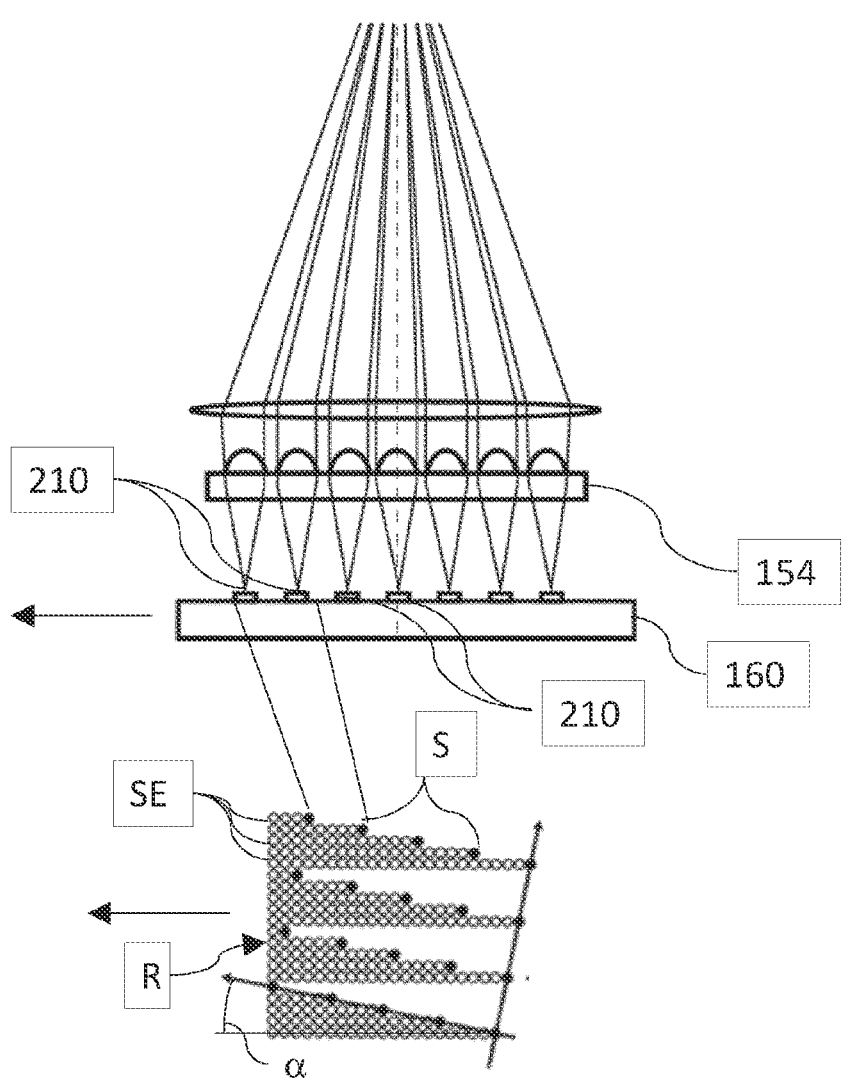
FIG. 2 is a simplified diagram illustrating an exemplary substrate and exposure pattern, according to some embodiments of the present disclosure.

FIG. 2 is a simplified diagram illustrating an exemplary lithography system and method for printing a pattern to a scanned substrate. In some embodiments, the lithographic apparatus 100 can project the radiation of the light sources 112 onto the substrate in a manner that does not form individual pixels for projection onto the substrate but rather a substantially continuous image for projection onto the substrate. The lithographic apparatus 100, particularly the light sources 112, can be arranged to provide pixel-grid imaging as described in more detail herein. As depicted in the upper diagram of FIG. 2, the spots 210 would appear to have an overlap based on the separation of lenslets in the micro-lens array. However, by scanning the substrate at certain angles, a printed pattern can be created with sufficient overlap of the spot sizes to avoid gaps in printing.

The filled in circles in the lower diagram of FIG. 2 represent the array of spots S (or 210 in the side view) projected onto substrate 160 by lens array 154 in projection system 150. Substrate 160 is moved relative to projection system 150 in the X-direction as a series of exposures are exposed on the substrate. The open circles represent spot exposures SE (or 210 in the side view) that may have previously been exposed on substrate 160. As shown, each spot projected onto substrate 160 by lens array 154 within projection system 150 exposes a row R of spot exposures on substrate 160. The complete pattern for the substrate 160 is generated by the sum of all the rows R of spot exposures SE exposed by each of spots S. Such an arrangement can be referred to as "pixel grid imaging." It will be appreciated that FIG. 2 is a schematic drawing, and that spots S can overlap in practice, for example as discussed further herein.

It can be seen that the array of radiation spots S can be arranged at an angle α relative to the substrate scanning direction (the edges of the substrate 160 lie parallel to the X- and Y-directions). This is done so that, when substrate 160 is moved in the scanning direction (the X-direction), each radiation spot will pass over a different area of the substrate, thereby allowing the entire substrate to be covered by the array of radiation spots S. In various embodiments, the angle α can be approximately 80°, 75°, 60°, 45°, 30°, 20°, 10°, 5°, 3°, 1°, 0.5°, 0.25°, 0.10°, 0.05°, or 0.01°. In some embodiments, the angle α is at least 0.0001°, e.g., at least 0.001°. The angle of inclination α and the width of the array in the scanning direction are determined in accordance with the image spot size and array spacing in the direction perpendicular to the scanning direction to ensure the whole surface area of the substrate 160 is addressed. In many of the embodiments discussed further herein, the angle, also referred to as a scan angle, can be approximately 45° due to the exemplary mirror arrays presented.

As used herein, the term "approximately" with regard to the scan angle means that the angle may not be exactly a particular angle but may, in practice, be slightly different due to the geometric details of the system. Accordingly, such numbers are given primarily for illustrative purposes and it should be understood that a person of skill would realize that exact value will vary.

In photolithography, a desired feature can be created on a substrate by selectively exposing a layer of resist on a substrate to radiation. Areas of the resist receiving a certain minimum radiation dose ("dose threshold") undergo a chemical reaction, whereas other areas remain unchanged. The thus created chemical differences in the resist layer allow for developing the resist, i.e., selectively removing either the areas having received at least the minimum dose or removing the areas that did not receive the minimum dose. As a result, part of the substrate is still protected by a resist whereas the areas of the substrate from which resist is removed are exposed, allowing e.g., for additional processing steps, for instance selective etching of the substrate, selective metal deposition, etc. thereby creating the desired feature. Patterning the radiation can be performed by controlling patterning device 110 such that the radiation that is transmitted to an area of the resist layer on the substrate within the desired feature is at a sufficiently high amplitude that the area receives a dose of radiation above the dose threshold during the exposure, whereas other areas on the substrate receive a radiation dose below the dose threshold by providing a zero or significantly lower radiation amplitude.

In practice, the radiation dose at the edges of the desired feature does not abruptly change from a given maximum dose to zero dose even if set to provide the maximum radiation amplitude on one side of the feature boundary and the minimum radiation amplitude on the other side. Instead, due to diffractive effects, the level of the radiation dose can drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by providing radiation to points on the substrate that are on or near the feature boundary not only to maximum or minimum amplitude levels but also to amplitude levels between the maximum and minimum amplitude levels. This can be referred to as "greyscaling" or "greyleveling."

Greyscaling can provide greater control of the position of the feature boundaries than is possible in a lithography system in which the radiation amplitude provided to the substrate can only be set to two values (namely just a maximum value and a minimum value). In some embodiments, at least three different radiation amplitude values can be projected, e.g., at least 4 radiation amplitude values, at least 8 radiation amplitude values, at least 16 radiation amplitude values, at least 32 radiation amplitude values, at least 64 radiation amplitude values, at least 100 radiation amplitude values, at least 128 radiation amplitude values, or at least 256 radiation amplitude values. If the patterning device is a radiation source itself (e.g., an array of light emitting diodes or laser diodes), greyscaling can be performed by controlling the amplitude levels of the radiation being transmitted. If the patterning device include mirror array 140, greyscaling can be performed by controlling the tilting angles of mirror array 140. Also, greyscaling can be performed by grouping a plurality of programmable elements and/or mirror array and controlling the number of elements and/or mirror array within the group that are switched on or off at a given time.

In one example, the patterning device (comprising one or more lithography devices providing a sequence of one or more exposures of a substrate) can have a series of states including: (a) a black state in which radiation provided is a minimum, or even a zero contribution to the amplitude distribution of its corresponding pixel; (b) a whitest state in which the radiation provided makes a maximum contribution; and (c) a plurality of states in between in which the radiation provided makes intermediate contributions. The entire plurality of states could be described as a sequence of grey states, between black and white, selectable to enable greyscale printing.

Figure 3:
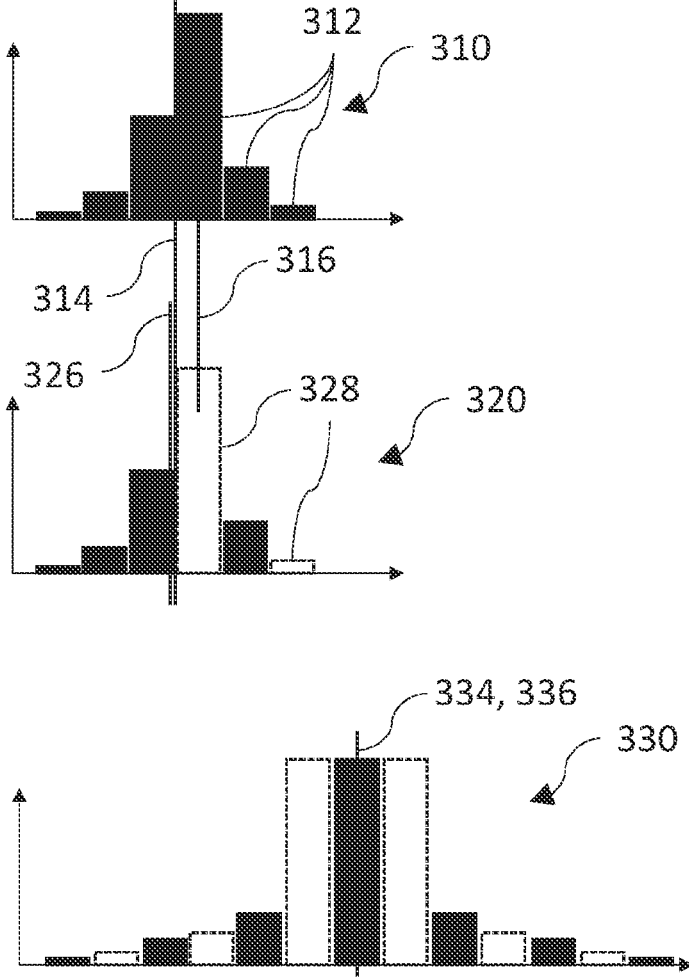
FIG. 3 is a simplified diagram illustrating pixel-grid imaging at the substrate, according to some embodiments of the present disclosure.

FIG. 3 is a simplified diagram illustrating exemplary sequences of delivering light with a given center of gravity to a substrate, according to some embodiments. When printing to a substrate, it is typically required that light of a given total or target intensity is delivered to a particular point or spot. When performing pixel grid imaging, the needed intensity can be built up from numerous spots that have intensities on for example, a bitwise scale as previously described with reference to "greyscaling." Thus, to deliver light of a particular intensity requires a certain combination of "intensity bits." For example, an intensity of 5 (on some bitwise scale for light intensities deliverable by the optical system) requires delivery of two intensity 1 bits $(2\times2^1)$ and one intensity 1 bit $(1\times2^0)$. Depending on how these light pulses are delivered, the resultant intensity pattern can be off-center. Such off-center spots can thus cause defects or other problems in a lithographic manufacturing process. It is understood that the intensity scale utilized for patterning can vary as needed to provide a desired resolution in late delivery. For example, in some embodiments, the sequence of intensities may be delivered according to a 4, 5, 6, 7, 8, etc. bit intensity distribution to provide 16, 32, 64, 128, 256, etc. different intensity values. An 8-bit intensity pattern to provide 256 radiation amplitude values was previously described with reference to FIG. 2.

The top portion of FIG. 3 depicts a distribution of intensities (ordinate of the plot) delivered at different times (abscissa of the plot) and thus to slightly different positions at the substrate. The different times/positions in the distribution are herein referred to as a "sequence," where sequence 310 is an example having six "intervals" 312 of light delivery, each having a particular bit intensity. The distribution, while in some embodiments controlled by the system to be as symmetric as possible while delivering the needed total intensity nevertheless has an asymmetry that can result in the spot being smeared off-center. This is seen by comparing the geometric center 314 (e.g., in FIG. 3 where there are three intervals on either side) with the "center of gravity" 316 which is the center of the resulting intensity-weighted distribution. As used herein, the term "center of gravity" (or COG) is understood to mean the weighted center of the intensities of light delivered to the substrate.

The middle portion of FIG. 3 depicts an example of the effect on the center of gravity of not delivering light during two portions of sequence 320. This example is intended to illustrate the effect on the center of gravity of including interval(s) where no light is delivered to the substrate. As depicted, the fourth and sixth bits in sequence 320 are not actually delivered to the substrate. In some implementations, switching off the bits (i.e., not delivering light to the substrate) can be utilized to modulate the intensity. However, this can cause a parasitic shift in the COG. To avoid delivering light to the substrate during a particular interval, in some embodiments, the particular mirror of DMD may be toggled to a different position that directs the beam to a dump instead of the substrate. In other implementations, the laser may be gated off, a different optic may be manipulated to interrupt the beam delivery, etc. As shown, the non-delivery of particular intervals in the sequence can result in a shifted center of gravity 326 of the resulting spot that is closer to the geometric center of gravity 314, however at a reduced intensity.

The bottom portion of FIG. 3 illustrates an alternate solution where sequence 330 delivers the same intensity as sequence 320 but in a symmetric pattern. Here, due to the symmetry, the geometric center 334 and the center of gravity 336 are at the same place. However, in this example, to create the symmetric pattern required 13 intervals instead of the six in sequence 310 and so effectively reduces the throughput by approximately a factor of two (due to doubling the time to deliver the required intensity).

Figure 4A:
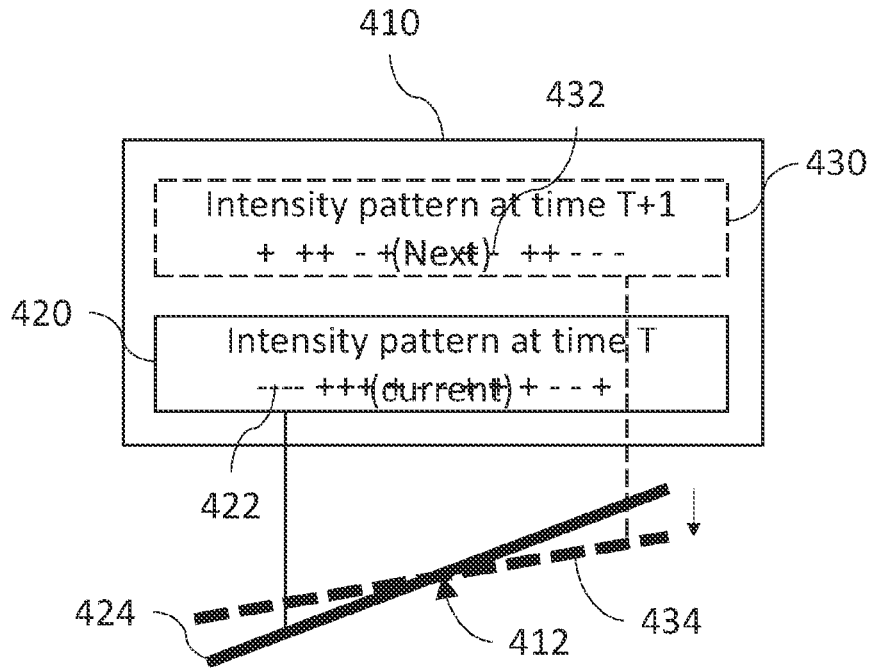
FIG. 4A is a simplified diagram illustrating a next pattern effect on a mirror position, according to some embodiments of the present disclosure.

FIG. 4A is a simplified diagram illustrating a next pattern effect on a mirror position, according to some embodiments. Because the printed pattern at the substrate often requires accuracy on the scale of nanometers, even very small effects on the delivery of light can cause impermissible deviations. In many embodiments, when providing light patterns to a substrate there may be a large number of configurations of the DMD that need to be stored and executed as the substrate is scanned past it. In certain embodiments, the physical memory (e.g., a CMOS memory circuit) can be located proximate the DMD such that electrical charges utilized for the storing of the sequence (e.g., including a next bit in the sequence) in the physical memory causes a deviation in an angle of a mirror in the DMD. For example, in certain embodiments, the physical memory can be located less than 1 mm (e.g., 10 micrometers) from the DMD. Thus, one technical problem addressed by the present disclosure is that the electrical charge used to store a later configuration may be proximate enough to affect the delivery of a current configuration. This is referred to herein as "next pattern effect." (NPE).

As illustrated in the simplified example of FIG. 4A, physical memory 410 can store a current configuration 422 for the mirrors of DMD in a first location 420. As previously explained, the current configuration can be positions (on/off) of the mirrors of a DMD at a given point in time. The total (target) intensity of light is delivered to the substrate via numerous configurations of the DMD as the substrate is scanned relative to the DMD. The charge distribution of current configuration 422 in the first location 420 is depicted with pluses (+) and minuses (−).

A single example mirror 412 of the DMD is shown in FIG. 4A. The mirror 412 can be set to have a target position 424 to deliver light to the substrate. However, a next location 430 in physical memory 410 can contain the next pattern that has a next charge distribution 432 that affects the orientation of the mirror (represented by intended angle 440). In some embodiments, the disclosed systems can include a control system configured to actuate mirrors to have a given orientation in the digital mirror device to deliver the sequence of intensities of light to the substrate. The orientation of the mirrors of the DMD can be achieved by the control system providing a specific electrostatic potential to switch the mirror angle between a position where it would deliver light to the substrate and where it would not. A MEMS-based optical switch is one example that may be used with a DMD. Thus, very slight changes to the mirror angle can be caused by the interaction of the electric field from the next charge distribution 432 with the electrostatically positioned mirror. This is depicted by the change in the mirror position from the target position 424 to a new (incorrect) position 434 (exaggerated for illustrative purposes). As described further herein, this next pattern effect can be mitigated utilizing modifications to the sequence of intensities of light to be delivered by the pattern stored in physical memory.

Figure 4B:
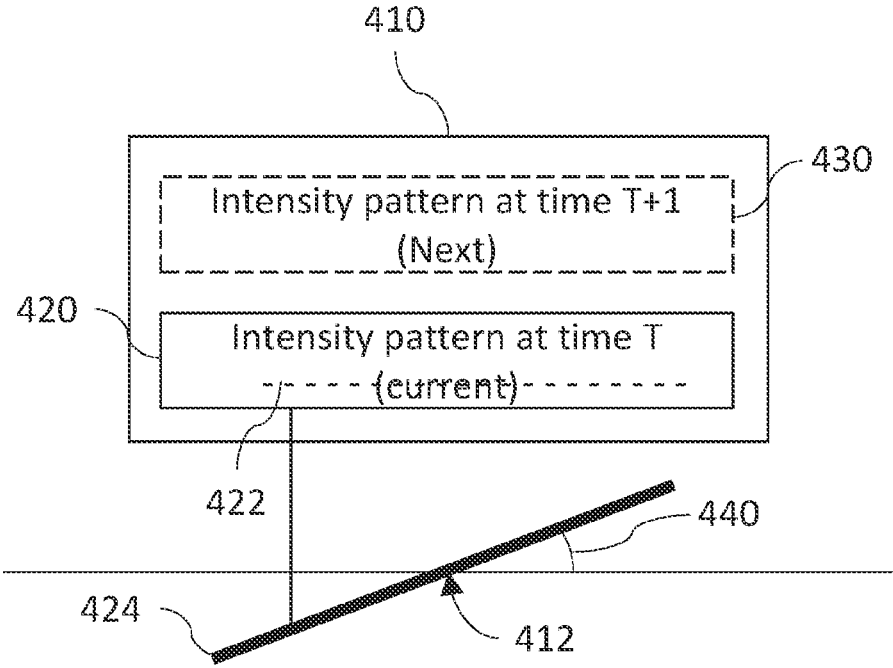
FIG. 4B is a simplified diagram illustrating a mirror in a correct position, according to some embodiments of the present disclosure.
Figure 4C:
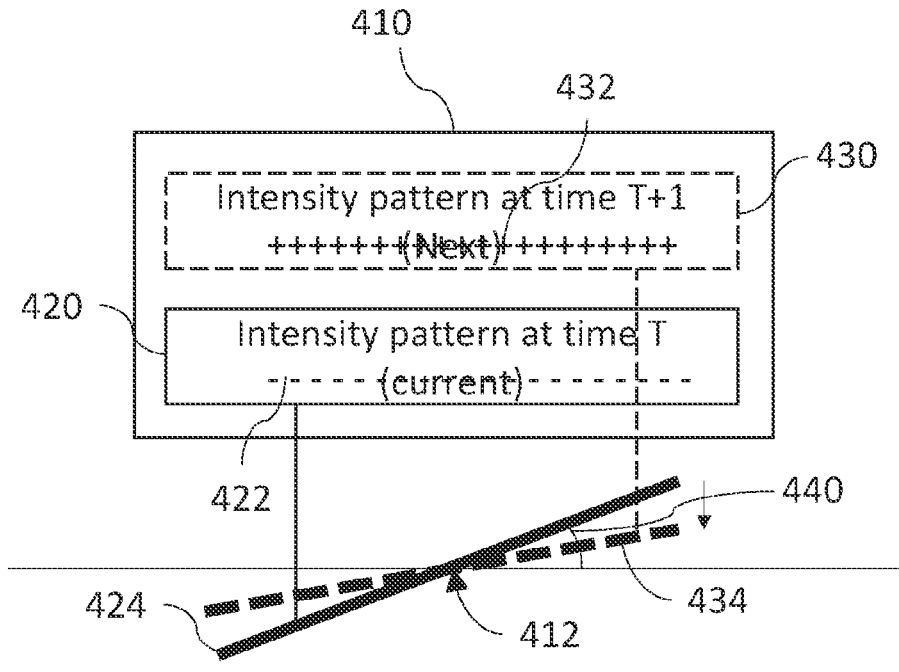
FIG. 4C is a simplified diagram illustrating a mirror in incorrect positions, according to some embodiments of the present disclosure.
Figure 4C:
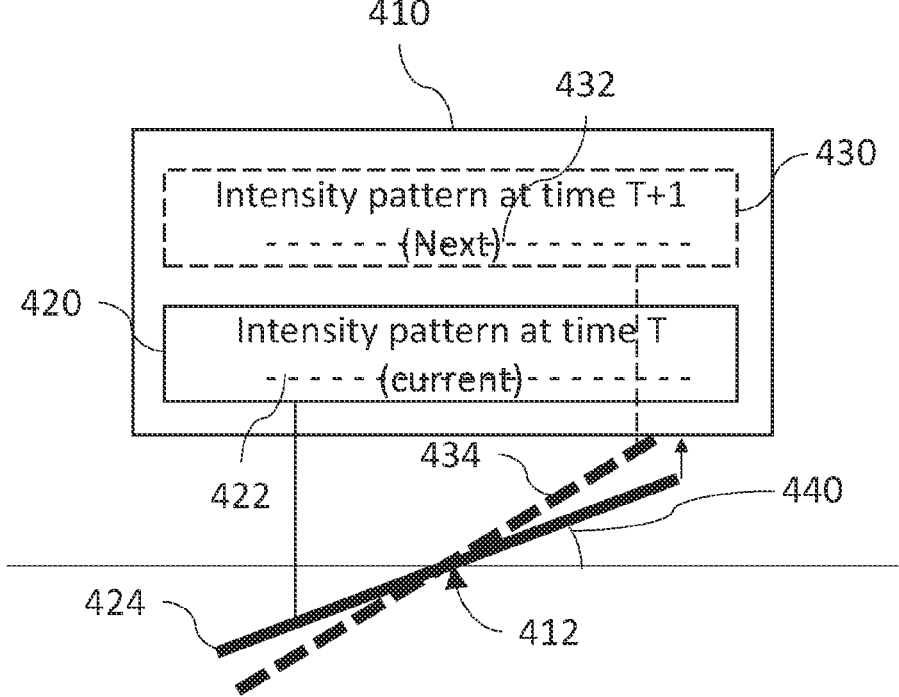

FIGS. 4B and 4C depict further illustrations of the next pattern effect. FIG. 4B illustrates a DMD in target position 424 and/or have the intended angle 440, for example if the next location 430 has no stored pattern, no charge stored, far away from first location 420, a charge distribution that is self-cancelling, etc., such that there is essentially no effect on the DMD. FIG. 4C illustrates two examples of the mirror in incorrect positions due to different next pattern effects. The top portion of FIG. 4C illustrates an exaggerated version of the next pattern effect due to an exemplary next charge distribution 432 having many or predominately positive charges. In this example, the effect is to reduce the angle of the mirror as indicated by the arrow and the incorrect position 434. The bottom portion of FIG. 4C illustrates an opposite example where the charges in the next charge distribution are predominately negative. Here, the mirror is deflected in the opposite direction, making the angle larger than the intended angle 440.

In some embodiments, other patterns besides a "next" pattern may also cause similar effects on mirror alignment. For example, storage of "previous" patterns sufficiently near the mirror can also cause such effects. Previous patterns may be stored in a memory buffer for recording purposes or for efficient reuse later in a sequence. As such, the present disclosure contemplates that the effect of storing electronic instructions in physical memory can cause an electrostatic effect that perturbs the mirror from its desired orientation. In this way, the methods described herein can be utilized to mitigate the effect of pattern storage in general, where the patterns may be "next," "previous," or any other pattern in the sequence such that its storage affects the DMD.

Figure 5A:
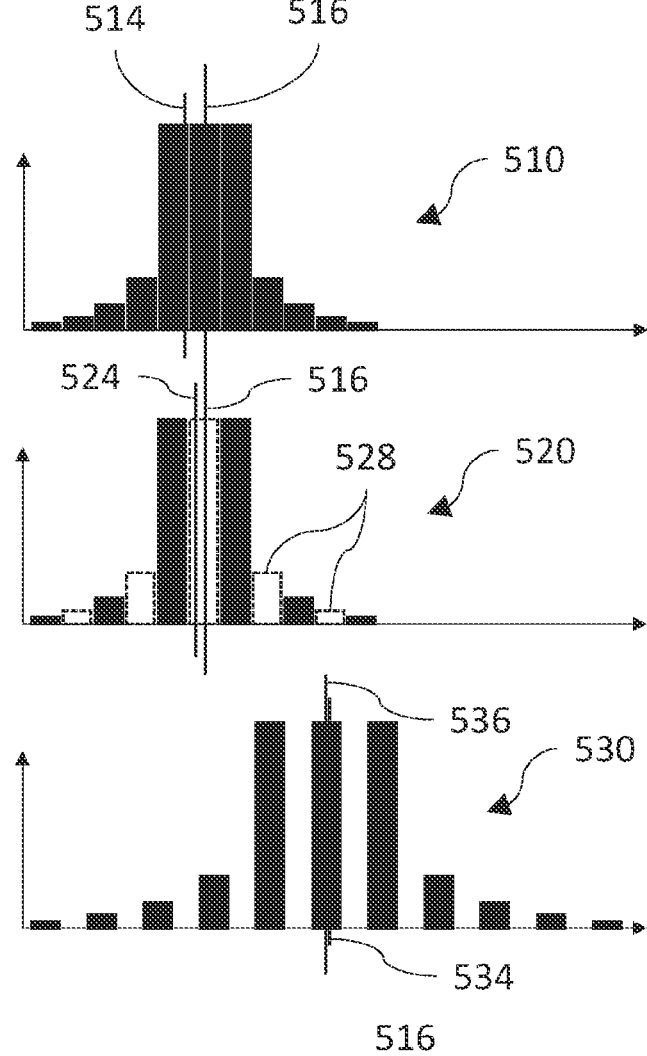
FIG. 5A is a simplified diagram illustrating shifting of the critical dimension, according to some embodiments of the present disclosure.

FIG. 5A is a simplified diagram illustrating methods for mitigating a next pattern effect, according to some embodiments. The next pattern effect can be mitigated by strategies similar to those previously discussed with reference to FIG. 3. Recall that the next pattern effect can slightly change the location where light is delivered. This result can be similar to the FIG. 3 examples of changes in the center of gravity of the light based on a particular sequence of intensities. The next pattern effect can similarly be mitigated by introducing intervals in the planned sequence where light is not delivered to the substrate even though a corresponding bit is still stored in physical memory. Because the NPE is deterministic, its effect on the center of gravity can be accurately determined aforehand for a given sequence.

The top portion of FIG. 5A depicts an exemplary sequence 510 of light delivered in 11 intervals. The sequence is symmetric and thus it would be expected that the center of gravity would be the same as the geometric center 516 of the sequence. However, due to the next pattern effect, the actual center of gravity 514 is shifted somewhat (shown exaggerated for illustrative purposes).

The middle portion of FIG. 5A illustrates that the NPE can be mitigated by selecting a sequence 520 with certain intervals 528 not delivered to the substrate. In this example, there are five such intervals 528, the center interval and two on either side. This has the effect of reducing the difference between the center of gravity 524 due to the NPE and the geometric center 516 (which is same as for sequence 510). However, by not delivering all of the light in the sequence, this changes the total intensity of the delivered light to be different than the desired or target intensity.

The bottom portion of FIG. 5A depicts an example illustrating another way to mitigate the next pattern effect. The sequence 530 shown can deliver the desired intensity (e.g., the same intensities in sequence 510) but with intervals skipped between each delivered interval, similar to the example shown in the middle portion of FIG. 5A. This method greatly reduces the NPE as apparent from the small difference between the geometric center 534 and the center of gravity 536 because the "Next Pattern" of every bit is 0, hence the COG shift for each mirror and each potential summed intensity is the same. However, this has the cost of requiring nearly twice as many intervals. This method thus has the cost of reducing the manufacturing throughput to deliver the light by almost a factor of two.

The skipping of frames as depicted in sequence 530 is different than having an interval 528 where substantially no light is delivered to the substrate. For example, in sequence 520, the (next) interval 528 still has a corresponding a bit stored in physical memory and thus would affect the current position of the mirror. However, because light in this interval is not delivered to the substrate, the effect is that the resultant center of gravity of the printed spot is effectively closer to the geometric (or intended) center of gravity. In contrast, skipping intervals entirely means that no bit is stored in physical memory. Here, the bit stored in memory is a fixed bit (e.g., either a 1 or a 0) to toggle the mirror position. Thus, such storage of bits that are not intensity dependent mitigates the next pattern effect. This significantly reduces the next pattern effect because the "next" bit/interval (that is intensity-dependent) is now a greater distance away in physical memory from the current instruction pattern. Restated, the electric field from these farther-stored instructions is substantially reduced at the mirror location by this increased distance and thereby the next pattern effect is much smaller.

Figure 5B:
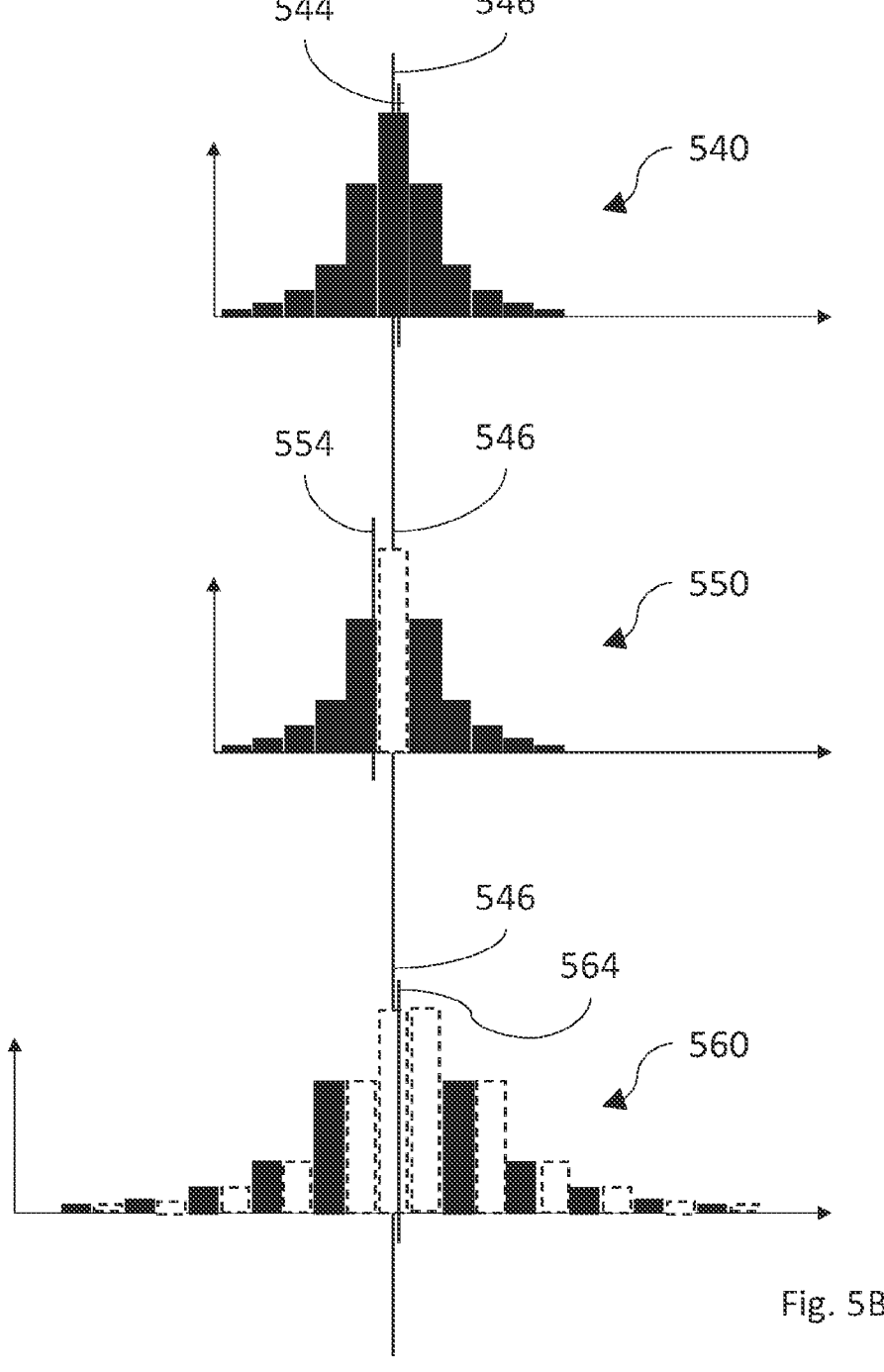
FIG. 5B is a simplified diagram illustrating another example illustrating mitigation of a next pattern effect, according to some embodiments of the present disclosure.

FIG. 5B is another example illustrating mitigation of a next pattern effect. Sequence 540 is a symmetric pattern where the COG 544 is almost aligned with the geometric center 546 of the sequence. The modified sequence 550 in the middle portion of FIG. 5B has a COG 554 that is different than the COG 544 due to including one interval that is not delivered to the substrate. This also has the effect of lowering the total intensity delivered by the sequence. Sequence 560, in the bottom portion of FIG. 5B, has a COG 564 that is almost correct. Similar to sequence 530, each cycle also includes "next" intervals where no light is delivered to the substrate. While COG 564 is significantly closer to the geometric center 546, this again increases the number of cycles required.

Figure 6:
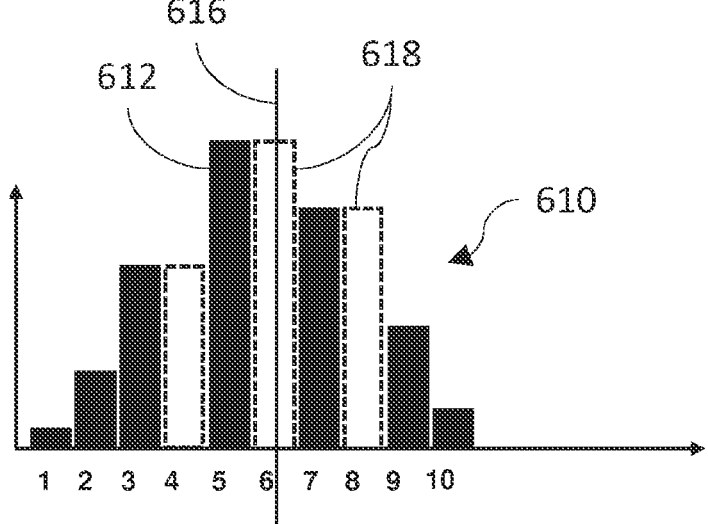
FIG. 6 is a process flow diagram illustrating a maskless lithography method, according to some embodiments of the present disclosure.
Figure 6:
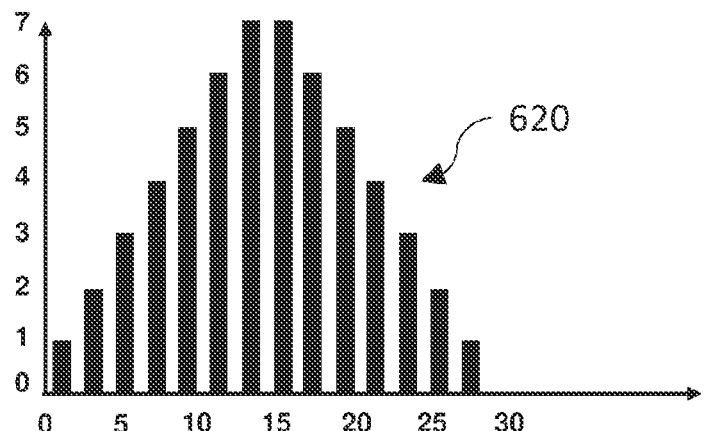

FIG. 6 is a simplified diagram illustrating methods for mitigating a next pattern effect, according to some embodiments. The present disclosure includes methods for improved sequencing of light delivery in a lithographic process. As shown in FIG. 6, this can include determining a sequence of intensities of light to be delivered that includes an interval within the sequence of intensities where substantially no light is delivered to the substrate (sometimes referred to herein as a "non-delivered interval"). After the sequence is determined, the method can include delivering light to a substrate by a light source utilizing a digital mirror device (DMD) according to the sequence of intensities. In some implementations, the presence of the interval can reduce an influence of an upcoming set of instructions in the sequence of intensities that is stored in the physical memory for a configuration of the DMD.

Some embodiments can also include determining a target intensity of light to deliver to a spot at the substrate, such as what may be required to treat a photoresist. Thus, in various embodiments, the determined sequence of intensities can be delivered to the substrate by the digital mirror device (DMD) to reach the target intensity where substantially no light is delivered to the substrate during the interval. In some embodiments, this can include determining the sequence of intensities separately for one or more (or each) of the mirrors in the DMD.

The example shown in the top portion of FIG. 6 of a sequence is similar to those described before but with some additional details that facilitate NPE mitigation and delivering the required intensity with a reduced number of intervals. The distribution of the intervals themselves need not be symmetric but rather may be determined to be some distribution that delivers the required intensity but with a reduced (or in other embodiments a minimum) number of intervals. Such embodiments can include determining a target intensity of light to deliver to a spot at the substrate. By using various techniques disclosed herein, some methods can further include determining an asymmetric distribution of the sequence of intensities that reduces a difference between a delivered center of gravity of the spot and the target center of gravity of the spot. The asymmetry in the optimized sequence can result from the optimization process that preserves the total desired power (e.g., represented by the sum of the intensity bits) but also has one or more intervals where substantially no light is delivered to the substrate.

The example of FIG. 6 has (top portion) a sequence 610 having an asymmetric distribution that reduces the total number of intervals needed. The center of gravity 616 is depicted in interval 6. Also, the example sequence 610 includes three intervals 618 where substantially no light is delivered to the substrate. In some embodiments, because the sequence of intensities can be represented by bits stored in physical memory, the effect on mitigating the NPE is largest when a non-delivered interval follows a delivered interval having a large intensity or bit value. In this way, intervals can be determined that are generally after the largest bits. As such, in some embodiments, at least one interval can be located in the sequence after a most significant bit. This is depicted in FIG. 6 by the most significant bit (MSB) 612 being at position 5, and a non-delivered interval 618 at position 6. Further benefits can be realized by the inclusion of other non-delivered intervals at select places in the sequence. For example, in FIG. 6, there are similar non-delivered intervals at positions 4 and 8 after the next two most significant bits (positions 3 and 7). However, in some implementations, not every interval need have a corresponding non-delivered interval because generally only the larger intensity bits contribute the most to the next pattern effect. Recall that in the example of FIG. 3, including a non-delivered interval between every delivered interval reduces the throughput significantly. As such, there are diminishing returns on mitigating the next pattern effect by the further inclusion of non-delivered intervals. Thus, in some embodiments, the determination of the sequence of intensities and any non-delivered intervals can further include utilization of a cost function whereby the cost function reflects a balance between having an accurate center of gravity and the increase in the number of intervals to do so. Such cost functions can be very beneficial when optimizing a manufacturing process as described herein. However, increasing the number of intervals does cost throughput but certain embodiments may sacrifice throughput in order to improve accuracy. Accordingly, some embodiments may utilize 6, 7, or 8 bit sequences with 1-5 additional cycles corresponding to the most significant bits.

The bottom portion of FIG. 6 illustrates one example of an alternate solution that may be used in some embodiments. Here, the determination can result in a sequence 620 of intensities that is symmetric. This can reduce (or eliminate)

a difference between a delivered center of gravity of the spot and a target center of gravity of the spot. This solution also has the advantage of providing a technically-simplified implementation, as compared to some other embodiments disclosed herein. Sequence 620 also illustrates that in some embodiments, the sequence of intensities can include skipping delivery of the light between two delivered intervals of light. However, because of the extra total number of intervals this can require, throughput may be reduced as previously explained in other examples herein.

Figure 7A:
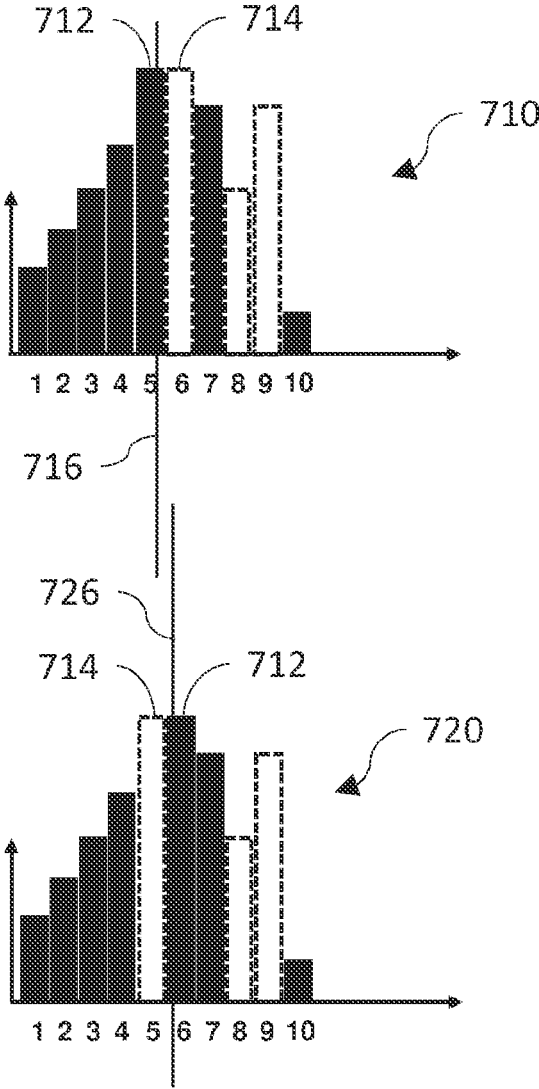
FIG. 7A is a simplified diagram illustrating an exemplary tuning of the center of gravity of a sequence of light intensities, according to some embodiments of the present disclosure.

FIG. 7A is a simplified diagram illustrating an exemplary tuning of the center of gravity of a sequence of light intensities, according to some embodiments. The determining of the sequence of intensities of light and any non-delivered intervals 718 can in some cases include placing a non-delivered interval in different locations in the sequence to optimize the center of gravity. For example, the top portion of FIG. 7 is one example sequence 710 where there is a delivered interval 712 at position 5 and a non-delivered interval 714 at position 6. The overall sequence of thus has a particular center of gravity 716. In some embodiments, the disclosed methods can include adjusting a delivered center of gravity by changing the sequence of the intensities or a location of the (non-delivered) interval. Changing the sequence of intensities can include making the sequence more symmetric, less symmetric, or any other changes as a result of shifting intensity bits from one position to another. In some embodiments, similar manipulations can be performed for non-delivered intervals. For example, as shown in the bottom portion of FIG. 7A for modified sequence 720, intervals 712 and 714 have been reversed from where they were in sequence 710. As shown, this slightly changes the center of gravity 726. In this way, the system and its associated algorithms can determine and fine-tune the center of gravity as needed for the application.

Figure 7B:
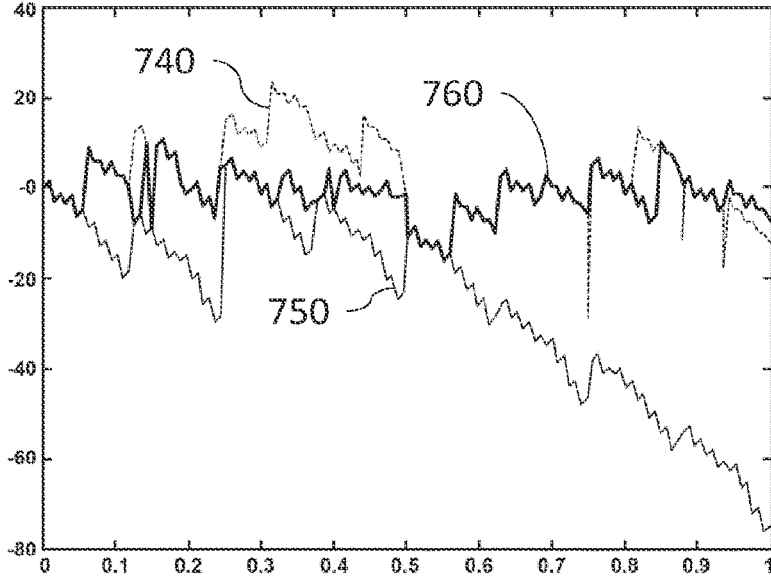
FIG. 7B illustrates a calculation of alternate locations for non-delivered light intervals, according to some embodiments of the present disclosure.

FIG. 7B illustrates a calculation of alternate locations for non-delivered light intervals. The COG can be calculated given: the intensity pattern (including alternative bit locations), the intensity written, and the NPE value (e.g., in nm). In FIG. 7B, example COG calculations were performed given a NPE of −66 [nm]. For all intensity patterns, alternative bit locations and the corresponding COG can be calculated. In this example, 8 possibilities from 3 alternative locations: 8, 16 and 32 were actually used for the calculation, but for illustrative purposes only two possibilities 740, 750 are shown. The alternative bit location used can thus be chosen for each individual intensity separately such that the COG of the sequence of intensities has a minimum deviation from the middle of the intensity-pattern (shown by the heavy line 760).

In some implementations, a brute-force approach can be used to find the best suitable intensity-pattern. To determine the best intensity-pattern we can define a cost function (CF) to determine which intensity-pattern gives the best results. One example of a cost can be the RMS value across the COG values calculated for each intensity of the profile after weighting them with the intensity itself. This is the RMS value of curve 760 in FIG. 7B. An intensity pattern that is calculated to have a lower cost has a lower COG shift than one with a higher cost, and results in improved patterning.

As one example of a brute force approach, the cost of all possible intensity-patterns possible can be determined by, for every number of bits to test in each number of frames in the sequence to test, determine all possible intensity patterns. Then, determine the possible zero frame/balancing bit locations in each intensity-pattern. In some implementations, to reduce the parameter space without overly impacting the final result, some low intensity bits can be fixed (i.e., not varied in location as part of the optimization). For example, the lowest two intensities can be fixed to the outer most locations to reduce the possibilities. Then, for each possible intensity pattern and possible alternative bit locations, calculate the cost. This can result in a very large number of configurations. The intensity pattern and alternative bit locations that give the lowest cost can be selected.

In other implementations, the determined sequence may begin symmetric, but with the method further including modifying the symmetric distribution into an asymmetric distribution (similar to sequence 610) by including an asymmetry into the sequence of intensities, the asymmetry further reducing the difference between the delivered center of gravity and the target center of gravity. Such an asymmetry can be created by substituting one combination of bits for another combination having different intensity contributions but the same total intensity.

Figure 8:
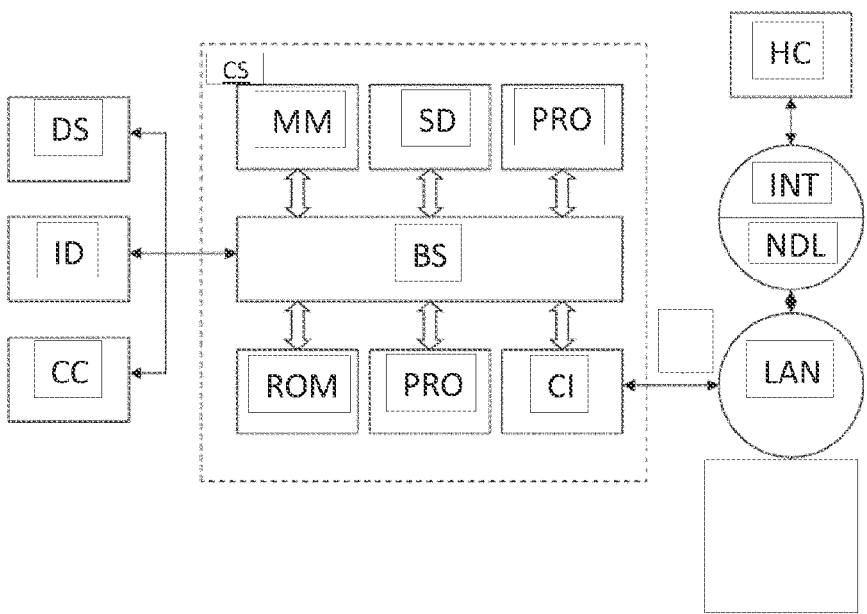
FIG. 8 is a block diagram of an example computer system, according to some embodiments of the present disclosure.

FIG. 8 is a block diagram of an example computer system CS, according to some embodiments.

Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 9:
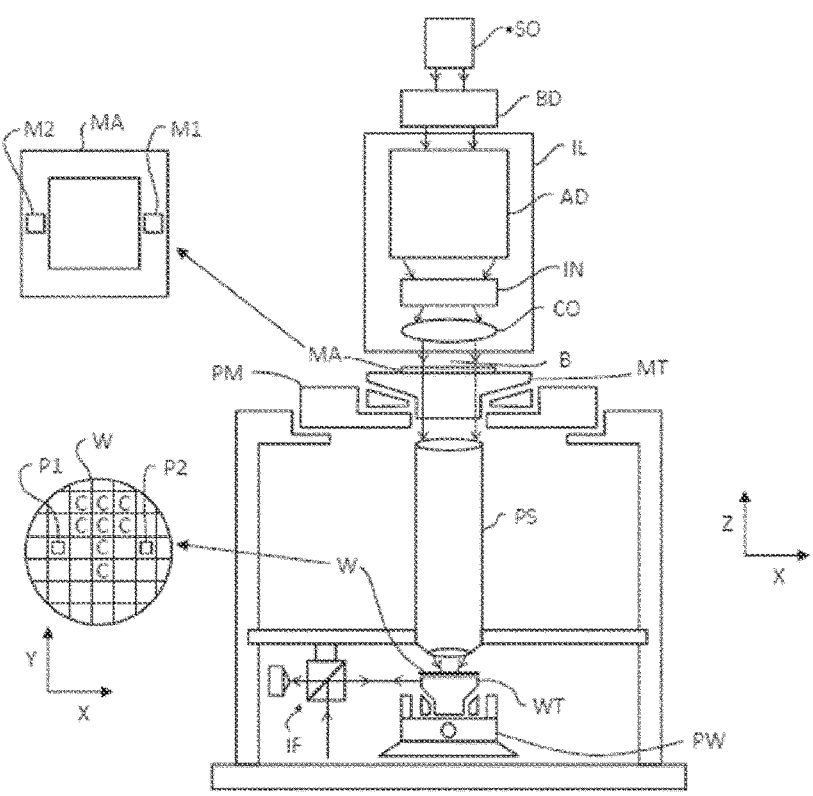
FIG. 9 is a schematic diagram of a lithographic projection apparatus, according to some embodiments of the present disclosure.

FIG. 9 is a schematic diagram of a lithographic projection apparatus, according to some embodiments.

The lithographic projection apparatus can include an illumination system IL, a first object table MT, a second object table WT, and a projection system PS.

Illumination system IL can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the amplitude distribution in the beam. In addition, it will generally comprise various other components, such as an integrator IN and a condenser CO. In this way, the beam B impinging on the patterning device MA has a desired uniformity and amplitude distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT.

Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g., so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 10:
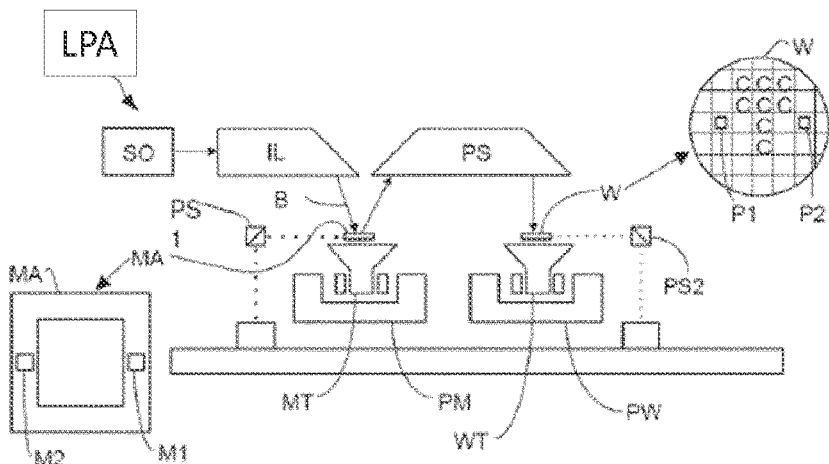
FIG. 10 is a schematic diagram of another lithographic projection apparatus, according to some embodiments of the present disclosure.

FIG. 10 is a schematic diagram of another lithographic projection apparatus (LPA), according to some embodiments.

LPA can include source collector module SO, illumination system (illuminator) IL configured to condition a radiation beam B (e.g., EUV radiation), support structure MT, substrate table WT, and projection system PS.

Support structure (e.g., a patterning device table) MT can be constructed to support a patterning device (e.g., a mask or a reticle) MA and connected to a first positioner PM configured to accurately position the patterning device;

Substrate table (e.g., a wafer table) WT can be constructed to hold a substrate (e.g., a resist coated wafer) W and connected to a second positioner PW configured to accurately position the substrate.

Projection system (e.g., a reflective projection system) PS can be configured to project a pattern imparted to the radiation beam B by patterning device MA onto a target portion C (e.g., comprising one or more dies) of the substrate W.

As here depicted, LPA can be of a reflective type (e.g., employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular amplitude distribution of the radiation beam. Generally, at least the outer and/or inner radial extent (commonly referred to as σ-outer and σ-inner, respectively) of the amplitude distribution in a pupil plane of the illuminator can be adjusted. In addition, the illuminator IL may comprise various other components, such as facetted field and pupil mirror devices. The illuminator may be used to condition the radiation beam, to have a desired uniformity and amplitude distribution in its cross section.

The radiation beam B can be incident on the patterning device (e.g., mask) MA, which is held on the support structure (e.g., patterning device table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g., patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g., patterning device table) MT and the substrate table WT are scanned synchronously while a pattern imparted to the radiation beam is projected onto target portion C (i.e. a single dynamic exposure). The velocity and direction of substrate table WT relative to the support structure (e.g., patterning device table) MT may be determined by the (de-)magnification and image reversal characteristics of the projection system PS.

In stationary mode, the support structure (e.g., patterning device table) MT is kept essentially stationary holding a programmable patterning device, and substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
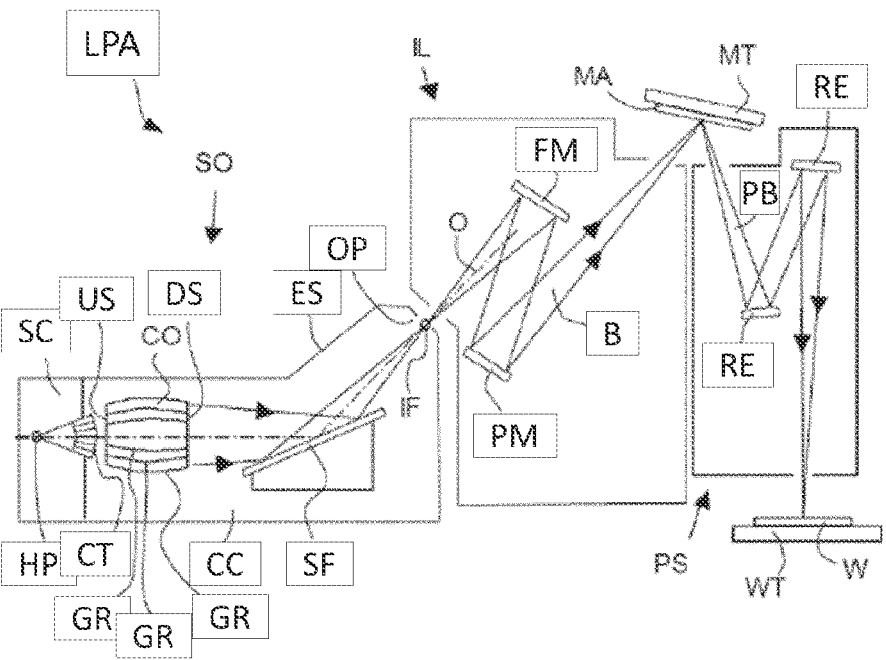
FIG. 11 is a detailed view of the lithographic projection apparatus, according to some embodiments of the present disclosure.

FIG. 11 is a detailed view of the lithographic projection apparatus, according to some embodiments.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 12:
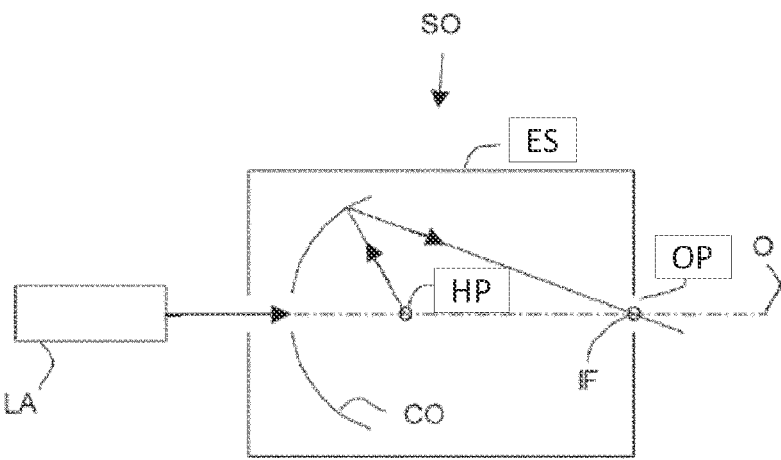
FIG. 12 is a detailed view of the source collector module of the lithographic projection apparatus, according to some embodiments of the present disclosure.

FIG. 12 is a detailed view of source collector module SO of lithographic projection apparatus LPA, according to some embodiments.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The concepts disclosed herein may simulate or mathematically model any generic imaging system for imaging sub wavelength features and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

Further embodiments are disclosed in the subsequent list of numbered clauses:

1. A method for improved sequencing of light delivery in a lithographic process, the method comprising: determining a sequence of intensities of light to be delivered that includes an interval within the sequence of intensities where substantially no light is delivered to the substrate; and delivering light to a substrate by a light source utilizing a digital mirror device (DMD) according to the sequence of intensities.

2. The method of any preceding clauses, the method further comprising determining a target intensity of light to deliver to a spot at the substrate.

3. The method of any preceding clauses, wherein the determined sequence of intensities is to be delivered to the substrate by the digital mirror device (DMD) to reach the target intensity and wherein substantially no light is delivered to the substrate during the interval.

4. The method of any preceding clauses, further comprising storing, in a physical memory, a set of instructions for the sequence of intensities of light.

5. The method of any preceding clauses, wherein the presence of the interval reduces an influence of an upcoming set of instructions in the sequence of intensities that is stored in the physical memory for a configuration of the DMD.

6. The method of any preceding clauses, wherein the sequence of intensities is represented by bits stored in physical memory and the interval is located in the sequence after a most significant bit.

7. The method of any preceding clauses, further comprising determining an asymmetric distribution of the sequence of intensities that reduces a difference between a delivered center of gravity of the spot and the target center of gravity of the spot.

8. A method for improved sequencing of light delivery in a lithographic process, the method comprising: determining a target intensity of light to deliver to a spot at a substrate; determining a sequence of intensities of light to be delivered to the substrate by a digital mirror device (DMD) to reach the target intensity, the sequence of intensities including an interval within the sequence of intensities where substantially no light is delivered to the substrate; storing, in a physical memory, a set of instructions for the sequence of intensities of light; and delivering light to the substrate by a light source utilizing the DMD according to the sequence of intensities, wherein the presence of the interval reduces an influence of an upcoming set of instructions in the sequence of intensities that is stored in the physical memory for a configuration of the DMD.

9. The method of any preceding clauses, wherein the sequence of intensities is represented by bits stored in physical memory and the interval is located in the sequence after a most significant bit.

10. The method of any preceding clauses, further comprising determining a symmetric distribution of the sequence of intensities that reduces a difference between a delivered center of gravity of the spot and a target center of gravity of the spot.

11. The method of any preceding clauses, further comprising modifying the symmetric distribution into an asymmetric distribution by including an asymmetry into the sequence of intensities, the asymmetry further reducing the difference between the delivered center of gravity and the target center of gravity.

12. The method of any preceding clauses, further comprising adjusting a delivered center of gravity by changing the sequence of the intensities or a location of the interval.

13. The method of any preceding clauses, wherein the sequence of intensities is an 8-bit intensity distribution.

14. The method of any preceding clauses, wherein the sequence of intensities is symmetric.

15. The method of any preceding clauses, wherein the sequence of intensities includes skipping delivery of the light between two delivered intervals of light.

16. The method of any preceding clauses, further comprising determining the sequence of intensities separately for each of a plurality of mirrors in the DMD.

17. The method of any preceding clauses, the changing the sequence of the intensities or a location of the interval further comprising: calculating a plurality of alternative bit locations and their corresponding centers of gravity as a function of intensity; and choosing alternative bit locations that has the minimum deviation from a middle of an intensity pattern delivered by the DMD.

18. The method of any preceding clauses, wherein the calculating includes performing a brute-force approach to calculate all possible intensity patterns in a parameter space except for at least one low-intensity bit that remains fixed.

19. A computer program product comprising a non-transitory computer readable medium having instructions recorded thereon, the instructions when executed by a computer implementing the method of any of the above method clauses.

20. A system for delivering light to a substrate, the system comprising: a light source; a digital mirror device; a physical memory configured to store instructions for delivery of light from the light source utilizing the digital mirror device; and a non-transitory computer readable medium having instructions recorded thereon, the instructions when executed by a computer cause operations comprising: determining a target intensity of light to deliver to a spot at a substrate; determining a sequence of intensities of light to be delivered to the substrate by a digital mirror device (DMD) to reach the target intensity, the sequence of intensities including an interval within the sequence of intensities where substantially no light is delivered to the substrate; storing, in a physical memory, a set of instructions for the sequence of intensities of light; and delivering light to the substrate by a light source utilizing the DMD according to the sequence of intensities, wherein the presence of the interval reduces an influence of an upcoming set of instructions in the sequence of intensities that is stored in the physical memory for a configuration of the DMD.

21. The system of any preceding system clauses, wherein the physical memory is located proximate the DMD such that electrical charges utilized for the storing of the sequence in the physical memory causes a deviation in an angle of a mirror in the DMD.

22. The system of any preceding system clauses, wherein the physical memory is located less than 1 mm from the digital mirror device.

23. The system of any preceding system clauses, further comprising a control system configured to actuate mirrors in the digital mirror device to deliver the sequence of intensities of light to the substrate.

24. The system of any preceding system clauses, further comprising a micro-lens array (MLA) configured to direct light from the DMD to the substrate.

The invention claimed is:

1. A method for improved sequencing of light delivery in a lithographic process, the method comprising:
determining a time-based sequence of intensities of light and a distribution of the determined time-based sequence of intensities to be delivered to a substrate, wherein the determined time-based sequence includes a plurality of intervals that includes an interval within the determined time-based sequence of intensities where substantially no light is delivered to a substrate; and
delivering light to a substrate by a light source utilizing a digital mirror device (DMD) according to the plurality of intervals of the determined time-based sequence of intensities.

2. The method of claim 1, further comprising determining a target intensity of light to deliver to a spot at the substrate.

3. The method of claim 2, wherein the determined time-based sequence of intensities is to be delivered to the substrate by the digital mirror device (DMD) to reach the target intensity and wherein substantially no light is delivered to the substrate during the interval.

4. The method of claim 3, further comprising storing, in a physical memory, a set of instructions for the determined time-based sequence of intensities of light.

5. The method of claim 4, wherein the presence of the interval reduces an influence of an upcoming set of instructions in the determined time-based sequence of intensities that is stored in the physical memory for a configuration of the DMD.

6. The method of claim 2, further comprising determining an asymmetric distribution of the determined time-based sequence of intensities that reduces a difference between a delivered center of gravity of the spot and a target center of gravity of the spot.

7. The method of claim 1, wherein the determined time-based sequence of intensities is represented by bits stored in physical memory and the interval is located in the sequence after a most significant bit.

8. A computer program product comprising a non-transitory computer readable medium having instructions recorded thereon, the instructions when executed by a system causes the system to implement the method of claim 1.

9. A method for improved sequencing of light delivery in a lithographic process, the method comprising:
determining a target intensity of light to deliver to a spot at a substrate;
determining a sequence of intensities of light to be delivered to the substrate by a digital mirror device (DMD) to reach the target intensity, the sequence of intensities including an interval within the sequence of intensities where substantially no light is delivered to the substrate;
storing, in a physical memory, a set of instructions for the sequence of intensities of light; and
delivering light to the substrate by a light source utilizing the DMD according to the sequence of intensities, wherein the presence of the interval reduces an influence of an upcoming set of instructions in the sequence of intensities that is stored in the physical memory for a configuration of the DMD.

10. The method of claim 9, wherein the sequence of intensities is represented by bits stored in physical memory and the interval is located in the sequence after a most significant bit.

11. The method of claim 8, further comprising determining a symmetric distribution of the sequence of intensities that reduces a difference between a delivered center of gravity of the spot and a target center of gravity of the spot.

12. The method of claim 11, further comprising modifying the symmetric distribution into an asymmetric distribution by including an asymmetry into the sequence of intensities, the asymmetry further reducing the difference between the delivered center of gravity and the target center of gravity.

13. The method of claim 9, further comprising adjusting a delivered center of gravity by changing the sequence of the intensities or a location of the interval.

14. The method of claim 13, wherein changing the sequence of the intensities or a location of the interval further comprising:

calculating a plurality of alternative bit locations and their corresponding centers of gravity as a function of intensity; and choosing alternative bit locations, such that COG of the sequence of intensities, has the minimum deviation from a middle of an intensity pattern delivered by an optical system comprising the DMD.

15. The method of claim 9, wherein the sequence of intensities includes skipping delivery of the light between two delivered intervals of light.

16. The method of claim 9, further comprising determining the sequence of intensities separately for each of a plurality of mirrors in the DMD.

17. A system for delivering light to a substrate, the system comprising:

a light source;

a digital mirror device;

a physical memory configured to store instructions for delivery of light from the light source utilizing the digital mirror device; and a non-transitory computer readable medium having instructions recorded thereon, the instructions when executed by one or more processors of the system cause the system to perform operations comprising:

determining a target intensity of light to deliver to a spot at a substrate;

determining a sequence of intensities of light to be delivered to the substrate by a digital mirror device (DMD) to reach the target intensity, the sequence of intensities including an interval within the sequence of intensities where substantially no light is delivered to the substrate;

storing, in a physical memory, a set of instructions for the sequence of intensities of light; and delivering light to the substrate by a light source utilizing the DMD according to the sequence of intensities, wherein the presence of the interval reduces an influence of an upcoming set of instructions in the sequence of intensities that is stored in the physical memory for a configuration of the DMD.

18. The system of claim 17, wherein the physical memory is located proximate the DMD such that electrical charges utilized for the storing of the sequence in the physical memory causes a deviation in an angle of a mirror in the DMD.

19. The system of claim 17, wherein the system is configured to manufacture computer chips.

20. The system of claim 17, wherein the system is configured to manufacture flat panel displays.

* * * * *